(12) United States Patent
Gaziello et al.

(10) Patent No.: US 6,536,003 B1
(45) Date of Patent: Mar. 18, 2003

(54) TESTABLE READ-ONLY MEMORY FOR DATA MEMORY REDUNDANT LOGIC

(75) Inventors: Laurent Gaziello, Nice (FR); Klaus Oberländer, San Jose, CA (US); Steffen Paul, München (DE); Volker Schöber, München (DE); Sabeen Randhawa, Mountain View, CA (US); Paolo Ienne, München (DE); Yannick Martelloni, Poing (DE); Rod Fleck, Mountain View, CA (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/500,414

(22) Filed: Feb. 8, 2000

(51) Int. Cl.[7] ............................. G11C 29/00; G11C 7/00
(52) U.S. Cl. .................... 714/710; 714/719; 365/201
(58) Field of Search ................... 714/710, 711, 714/719; 365/200, 201

(56) References Cited

U.S. PATENT DOCUMENTS

| 5,153,880 A | * | 10/1992 | Owen et al. ............ 714/710 |
| 5,233,566 A | | 8/1993 | Imamiya et al. |
| 5,278,839 A | * | 1/1994 | Matsumoto et al. ........ 714/710 |
| 5,523,975 A | * | 6/1996 | Reddy ................. 365/200 |
| 5,636,161 A | | 6/1997 | Mann |
| 5,708,601 A | | 1/1998 | McKenny et al. |
| 5,841,709 A | * | 11/1998 | McClure ............... 365/200 |
| 6,175,936 B1 | * | 1/2001 | Higgins et al. ............ 714/711 |
| 6,181,614 B1 | * | 1/2001 | Aipperspach et al. ........ 365/200 |
| 6,208,570 B1 | * | 3/2001 | Brown et al. ............. 365/201 |

FOREIGN PATENT DOCUMENTS

| EP | 674264 A1 | * | 9/1995 | ............ G06F/11/20 |
| EP | 0 702 373 B1 | | 12/1999 | |

* cited by examiner

Primary Examiner—Albert Decady
Assistant Examiner—Joseph D. Torres
(74) Attorney, Agent, or Firm—Laurence A. Greenberg; Werner H. Stemer; Ralph E. Locher

(57) ABSTRACT

The testable read-only memory for data memory redundant logic has read-only memory units for storage of determined fault addresses of faulty data memory units. The serviceability of each read-only memory unit can be checked by application of input test data and by comparison of read output test data with expected nominal output test data.

13 Claims, 2 Drawing Sheets

TESTABLE READ-ONLY MEMORY FOR DATA MEMORY REDUNDANT LOGIC

BACKGROUND OF THE INVENTION

Field of the Invention

The invention relates to a testable read-only memory for data memory redundant logic for the storage of fault addresses, determined in a test procedure, of faulty data memory units within a main data memory.

The increasing memory requirement for application programs has led to the memory sizes of semiconductor memories having increased greatly in recent years. With the increase in memory size, and the concomitant increased integration level, in the production of semiconductor memories, there is an increase in the probability of individual data memory units in the semiconductor memory being produced with faults in the production process, and thus being unfit for use. In order that the failure of isolated data memory units does not lead to the entire semiconductor memory becoming unserviceable or defective, redundant memory areas are increasingly being installed in data memories. Such redundant memories contain a redundant address memory with a plurality of redundant address memory units, as well as a redundant data memory with redundant data memory units. Each redundant address memory unit has an associated redundant data memory unit.

If a faulty data memory unit is found within the main data memory during a test process, the fault address for the faulty data memory unit is written to an address memory unit in the redundant address memory and, when data access is made to this fault address, the associated data memory unit within the redundant data memory is accessed rather than the faulty data memory unit within the main data memory.

This readdressing process allows a certain number of faulty data memory units within the main data memory to be replaced by redundant data memory units within the redundant data memory.

The access to the redundant address memory and to the redundant data memory is controlled by redundant control logic that is integrated in the data memory. The redundant address memory within the redundant control logic is formed by address registers which, if the power supply fails, lead to the loss of the fault addresses stored in them for faulty data memory units within the main data memory.

The fault addresses of faulty data memory units determined in the test process are thus additionally permanently programmed into a read-only memory, in which case the fault addresses in this memory are written once again, if required, to the redundant address memory. The read-only memories in this case comprise a large number of read-only memory units, which permanently store the address BITs of the fault addresses.

Reference is now had to FIG. 1, which shows a read-only memory unit according to the prior art. The read-only memory unit contains a fuse link device F, to which a BIT, for example an address BIT, can be written permanently, i.e., non-erasably. As a rule, the fuse link device F comprises a fusible resistor, which is composed of metal or polysilicon.

When a control signal is applied to a write terminal W a P-channel MOSFET P1 that is connected to the supply voltage VDD is switched through, so that a potential node P can be precharged in order to precharge the fuse link device F.

The BIT written to the fuse link device F can be read by application of a read signal R to the gate of the MOSFET T2, which is complementary to the first MOSFET.

Application of a control signal GND to the transistor T3 results in the data value written in the fuse link device being drawn to ground, and thus becoming logic 0.

A latch circuit which comprises two feedback inverter circuits I1, I2 is connected downstream of the potential node P. A data output buffer A is connected downstream of the latch circuit. The data output buffer A likewise comprises an inverter.

The BIT read from the fuse link device F is applied to the output DA of the output buffer A when a read control command is applied to the terminal R.

The read-only memory unit shown in FIG. 1 has the disadvantage that its own serviceability cannot be tested.

If a circuitry fault occurs during the process of producing the read-only memory, an incorrect logic value may in some circumstances be present at the output DA of the read-only memory unit.

For example, in the event of a power failure and the subsequent writing of the fault addresses from the read-only memory, an incorrect address will be written to the redundant address memory in the redundant control logic. The readdressing of a faulty data memory unit within the main data memory to a redundant data memory unit within the redundant data memory will then be permanently faulty.

SUMMARY OF THE INVENTION

The object of the invention is to provide a testable read-only memory for data memory redundant logic which overcomes the above-noted deficiencies and disadvantages of the prior art devices and methods of this kind, and which allows checking for serviceability by means of a test process.

With the above and other objects in view there is provided, in accordance with the invention, a testable read-only memory for data memory redundant logic, comprising:

a plurality of read-only memory units for storing determined fault addresses of faulty data memory units, wherein a serviceability of each the read-only memory unit can be checked by application of input test data and by comparison of read output test data with expected nominal output test data.

In other words, the objects of the invention are satisfied with the testable read-only memory for data memory redundant logic having read-only memory units for storage of determined fault addresses of faulty data memory units, in which the serviceability, i.e., the functionality, of each read-only memory unit can be checked by application of input test data and by comparison of read output test data with expected nominal output test data.

In accordance with an added feature of the invention, each read-only memory unit stores one address BIT of a fault address.

In accordance with an additional feature of the invention, the read-only memory is switchable between a test mode and a normal mode.

In accordance with another feature of the invention, the read-only memory units comprise a fuse link device for non-erasable writing of an address BIT. Preferably, the fuse link device is a fusible resistor composed of metal or polysilicon.

In accordance with a further feature of the invention, the read-only memory unit has a read circuit for reading a written address BIT.

In accordance with again an added feature of the invention, a latch circuit with two feedback inverters is connected downstream of the read circuit.

In accordance with again an additional feature of the invention, the latch circuit includes a multiplexer.

In that case, the multiplexer preferably includes a control terminal for switching between a test mode and a normal mode.

In accordance with again another feature of the invention, the multiplexer includes a first data input for application of test data.

In accordance with again a further feature of the invention, the latch circuit includes a first inverter with an output, and the multiplexer has a second data input connected to the output of the first inverter.

In accordance with yet an added feature of the invention, the latch circuit includes a second inverter with an input, and the multiplexer has an output connected to the input of the second inverter.

In accordance with yet an additional feature of the invention, a data output buffer is connected to the second data input of the multiplexer and to the output of the first inverter.

In accordance with yet another feature of the invention, a serial shift register with a sampling flip-flop is provided, and the data output buffer outputs the data to the sampling flip-flop in the serial shift register.

In accordance with yet a further feature of the invention, a data output of the sampling flip-flop is connected to the first data input of the multiplexer for application of test data.

In accordance with yet again an added feature of the invention, there is provided a redundant control logic in a data memory, the data memory including a redundant data memory and a main data memory.

In accordance with yet again an additional feature of the invention, the redundant control logic has a redundant address memory and the redundant data memory.

In accordance with yet again another feature of the invention, the redundant address memory is connected such that the fault addresses stored in the read-only memory can be read to the redundant address memory in the redundant control logic.

In accordance with yet again a further feature of the invention, the redundant data memory comprises a plurality of redundant data memory units for replacement of faulty data memory units within the main data memory.

In accordance with a preferred feature of the invention, the redundant address memory units are registers.

In accordance with a concomitant feature of the invention, a self-test logic is integrated in the data memory, and wherein the input test data and the nominal output test data are produced by self-test logic integrated in the data memory.

The testable read-only memory according to the invention is preferably likewise integrated in the data memory.

Other features which are considered as characteristic for the invention are set forth in the appended claims.

Although the invention is illustrated and described herein as embodied in a testable read-only memory for data memory redundant logic, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
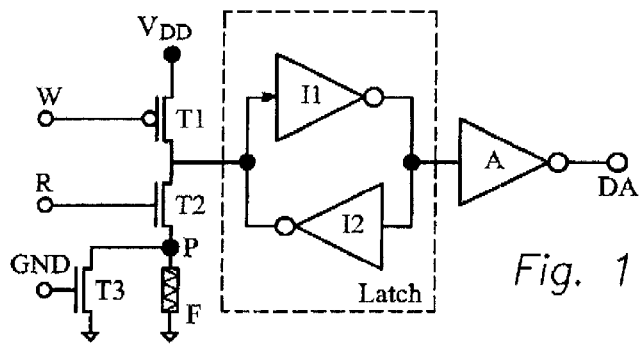
FIG. 1 is a schematic diagram of a read-only memory according to the prior art.
Figure 2:
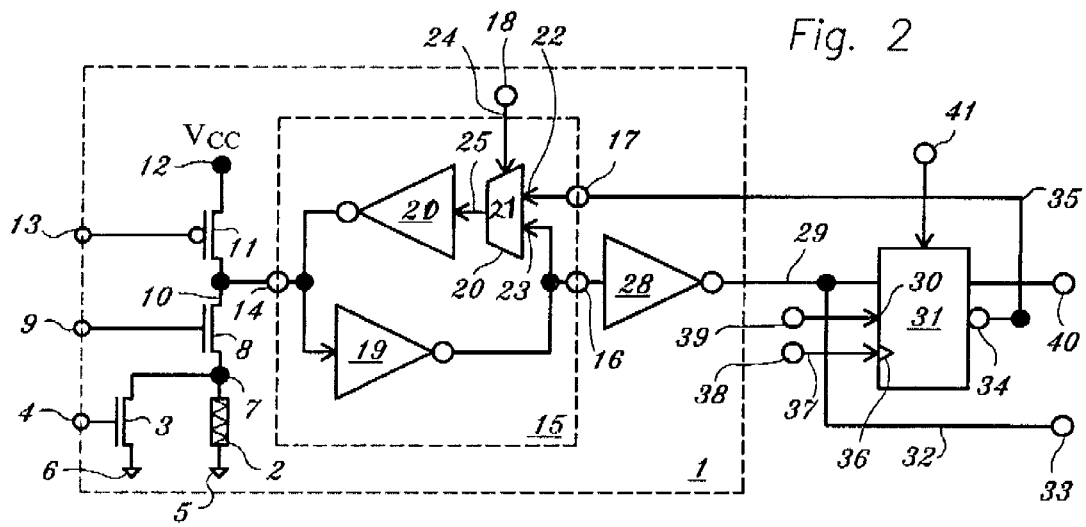
FIG. 2 is a schematic diagram of a first embodiment of a read-only memory unit to form the read-only memory according to the invention.

Referring now to the figures of the drawing in detail and first, particularly, to FIG. 2 thereof, there is seen a first embodiment of a read-only memory unit according to the invention for a testable read-only memory.

The read-only memory unit 1 contains a fuse link device 2, which comprises a fusible resistor composed of metal or polysilicon.

A first MOSFET transistor 3, for application of a grounding control signal via the terminal 4 of the MOSFET 3, is connected in parallel with the fuse link device 2.

The fuse link device 2 is grounded via a connection 5, and the MOSFET 3 is grounded via a connection 6.

The other connection 7 of the fuse link device 2 is directly connected to the parallel-connected MOSFET 3.

A further MOSFET 8 is connected to the connection 7, and its gate is connected to a further terminal 9 of the read-only memory unit 1. The voltage which is present at the potential node 7 is read via the MOSFET 8 to the potential node 10 by application of a control signal to the terminal 9. The potential node 10 can be connected to a supply voltage connection 12 via a third MOSFET 11.

The gate of the third MOSFET 11 is connected to a further terminal 13 of the read-only memory unit 1. The MOSFET 11 is designed to be complementary to the two other MOSFETs 3, 8.

In the embodiment shown in FIG. 2, the MOSFET 11 is a P-channel MOSFET, and the two other MOSFETs 3, 8 are N-channel MOSFETs.

The supply voltage which is present at the potential node 12 can be connected to the potential node 10, in order to precharge the fuse link device 2, by application of a control signal to the control terminal 13 of the P-channel MOSFET 11. The potential node 10 is connected to the signal input 14 of a latch circuit 15.

The latch circuit 15 has the signal input 14, a signal output 16, a test data input 17, and a control terminal 18 for mode switching.

The latch circuit 15 comprises two feedback inverter circuits 19, 20, located in a feedback loop, as well as a multiplexer 21 which can be switched between two data inputs 22, 23, controlled via a control line 24. The control line 24 is connected to the control terminal 18 for switching the mode of the latch circuit 15. The output of the multiplexer 21 is connected via a line 25 to the input of the inverter 20. The output of the inverter 20 is connected to the input of the inverter 19. The output of the inverter 19 is in turn connected to the data input 23 of the multiplexer 21, via a feedback line 27.

The data input 23 of the multiplexer 21 as well as the output of the inverter 19 are directly connected to the signal output 16 of the latch circuit 15. The signal output 16 of the latch circuit 15 is connected to one input of a data output buffer 28. In the embodiment shown in FIG. 2, the data output buffer 28 consists of an inverter circuit.

The data output buffer 20 outputs the data that are present at the signal output 16 of the latch circuit 15, in inverted form, via a line 29 to a control connection 30 of a sampling flip-flop 31.

The sampling flip-flop 31 forms a part of a serial shift register. In the embodiment shown in FIG. 2, the sampling flip-flop is a D-flip-flop, whose D-input is connected to the line 29.

The logic value which is present on the output line 29 can be read via a data output terminal 33, via a line 32. One data output 34 of the sampling flip-flop 31 is fed back to the test data input 17 of the latch circuit 15 via a feedback line 35. The sampling flip-flop 31 furthermore has a clock input 36, which is connected via a clock line 37 to a clock input connection 38 for application of a clock signal.

Test data can be written via a test data input connection 39 to the sampling flip-flop 31 in the serial shift register.

Test data can be read from the sampling flip-flop 31 in the serial shift register via a test data output terminal 40 of the sampling flip-flop 31.

A test control terminal 41 is used to control whether the value that is present at the test data input 39 or the logic value that is present at the input 30 is buffer-stored in the sampling flip-flop 31, and is present at the data output 34 of the sampling flip-flop 31.

In the first embodiment of the read-only memory unit according to the invention shown in FIG. 2, the output 29 of the data output buffer 28 produces, in the test mode, a logic value which is the inverse of that logic value which is present at the test data output 17 of the latch circuit 15 when the read-only memory unit is fit for use. For this purpose, a changeover to the data input 22 is made by application of a control signal to the control terminal 18 of the multiplexer 21, and the test data are injected into the feedback loop comprising the two inverters 19, 20. From there, the injected test data are output, through the data output buffer 28 and in inverted form, to the output 29, and can then be read via the data read terminal 33.

Since all the test data that are present at the connection 17 pass through an odd number of inverters, namely the inverters 20, 19, 28, the value which is read at the data read terminal 33 must be the inverse of the test data, provided the read-only memory unit 1 is fit for use.

In the normal mode, a changeover is made to the other data input 23 via the control terminal 18 of the multiplexer 21, and the feedback loop is thus closed once again.

In order to read the BIT stored in the fuse link device 2, the read MOSFET 8 is switched on by application of a control signal to the gate terminal 9, and the logic value present at the potential node 10 is maintained in the feedback loop, and is read to the line 29 via the output buffer 28.

Figure 3:
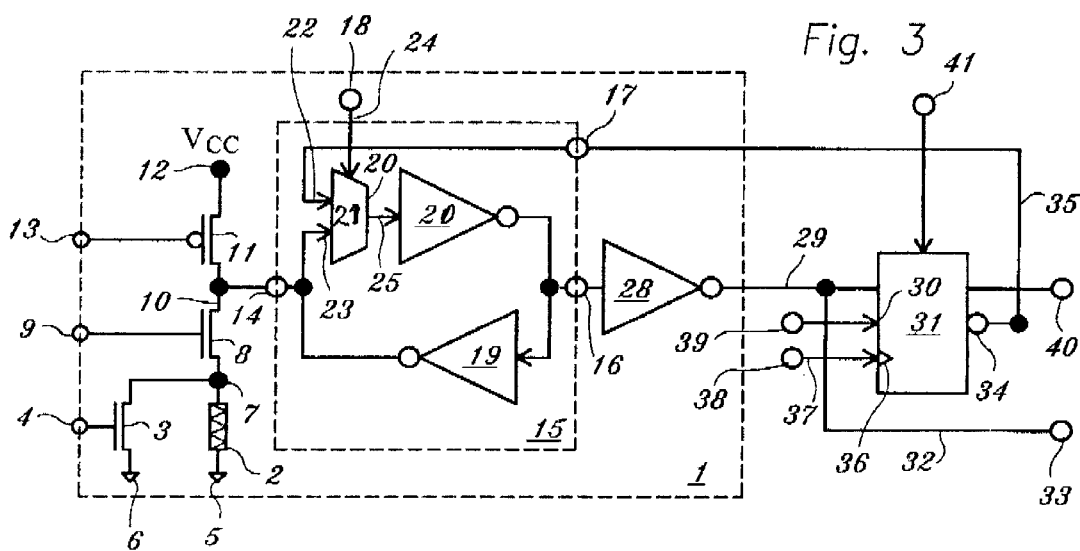
FIG. 3 is a schematic diagram of a second embodiment of a read-only memory unit to form a testable read-only memory according to the invention.

FIG. 3 shows a further embodiment of the read-only memory unit 1 according to the invention. In this embodiment, the test data are injected into the feedback loop via the feedback line 35 in such a manner that, in the test mode, they pass through an even number of inverters, so that, when no faults are present, the logic value that is present at the data read terminal 33 corresponds to the injected test data value.

Figure 4:
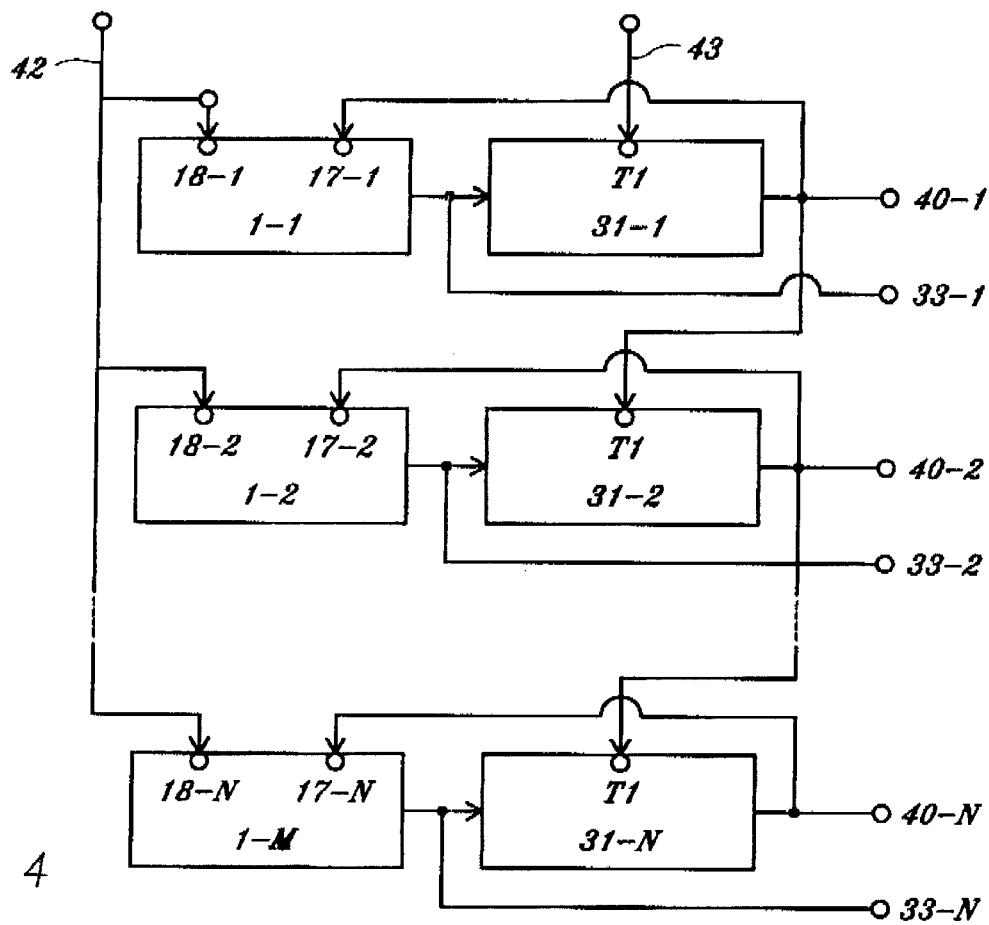
FIG. 4 is a partial block diagram of the formation of a read-only memory according to the invention comprising a plurality of read-only memory units.

FIG. 4 shows the design of a complete testable read-only memory according to the invention, which is formed from a large number of read-only memory units, as are shown in FIGS. 2, 3. The read-only memory units 1-1 to 1-N are actuated via a common control line 42 in order to switch between the test mode and the normal mode.

The sampling flip-flops 31-1 to 31-N form a serial shift register, with test data being shifted into the test input 39-1 of the first sampling flip-flop 31-1 via a data line 43. The test data inputs 39-2 to 39-N of the downstream sampling flip-flops 31-2 to 31-N are each connected to the test data output 40-1 to 40-N of the preceding sampling flip-flop.

The testable read-only memory is formed by the read-only memory units 1-1 to 1-N. In order to test the read-only memory according to the invention, the read-only memory units are initially switched to the test mode via the control line 42, and test data are then written to the serial shift register.

In a further step, output test data are read via the test data read connections 33-1 to 33-N, and the read test data are compared with expected nominal test data. If the read output test data match the expected nominal output test data, the read-only memory 1 is serviceable. If the read output test data and the expected nominal output test data do not match, the testable read-only memory is not serviceable. Fault action is taken.

If the read-only memory is formed from read-only memory units 1 designed as shown in FIG. 2, the test data pass through an odd number of inverters in the test mode, so that the output test pattern corresponds to the inverse of the input test pattern when the read-only memory units 1 are operating without any faults.

If the testable read-only memory is formed from read-only memory units 1 designed as shown in FIG. 3, the read output test data pattern is identical to the input test data pattern, provided the read-only memory units are all operating completely without any faults.

Figure 5:
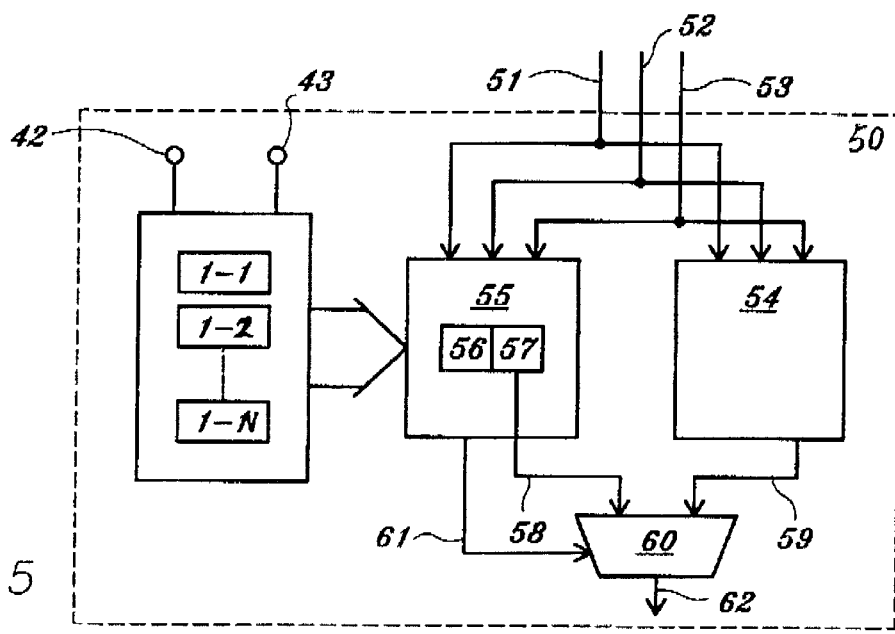
FIG. 5 is a block diagram of the read-only memory according to the invention within a data memory.

FIG. 5 shows a data memory unit 50 in which a testable read-only memory according to the invention is fitted.

The testable read-only memory according to the invention comprises a plurality of read-only memory units 1-1 to 1-N. Each read-only memory unit 1 is able to store one BIT of a fault address. The data memory 50 is connected to an address bus 51, a data bus 52 and to a control bus 53. In this case, the data memory 50 has a main data memory 54, and redundant control logic 55 connected in parallel with it.

The redundant control logic 55 contains a redundant address memory 56 and a redundant address memory 57. In this case, the redundant address memory 56 has a plurality of redundant address memory units, which are each assigned a redundant data memory unit within the redundant address memory 57. The addresses of the data memory units which have been identified as being faulty within the main data memory 54 are contained in the read-only memory.

The redundant data memory 57 and the main data memory 54 are connected via data lines 58, 59 to a multiplexer 60 which is controlled by the redundant control logic 55 via a control line 61. The multiplexer 60 has data output lines 62, which are switched between the data lines 58 and the data lines 59 depending on the control signal applied to the line 61.

In the event of a power failure, the addresses stored in the read-only memory are loaded via address lines 63 into the redundant address memory units in the redundant address memory 56. When a data access is made to such a fault address, the associated redundant data memory unit within the redundant data memory 57 is accessed rather than the faulty data memory unit within the main data memory 54. The address lines 63 are connected to the data output connections 33-1 to 33-N of the read-only memory.

The read-only memory is switched between the normal mode and the test mode via the control terminal 42. In the test mode, the read-only memory is tested by application of a test data pattern to the fixed data input 43, by writing a test data pattern and by subsequently reading a test data output pattern, with the read output test data pattern being compared with a nominal output test data pattern.

In the normal mode, the addresses stored in the read-only memory are loaded, for example after a power failure, into the redundant address memory 56 in the redundant control logic 55.

The input test data pattern and the nominal output test data pattern are preferably produced and evaluated by means of self-test logic integrated in the data memory 5.

As an alternative to this, the input test data patterns as well as the nominal output test data patterns can also be produced and evaluated in automatic test equipment that has been connected.

One advantage according to the invention of the testable read-only memory is that the serviceability of the read-only memory can be tested without burning the fuse link device 2. The fuse link device is not burnt until after the serviceability of the latch circuit 15 and of the data output buffer 28 has been confirmed in the test mode. The testable read-only memory according to the invention ensures fault-free readdressing of data memory units which have been identified as being faulty within the main data memory 54. A fault action is carried out in order to identify a fault in the testable read-only memory, and there is no need to burn the fuse link devices 2 within read-only memory units 1 that have been identified as being faulty.

This results in a considerable time saving since a faulty read-only memory is identified even before the process of burning the fuse link devices, rather than only after this time-consuming burning process.

We claim:

1. A testable read-only memory for data memory redundant logic in a data memory, comprising:

a plurality of sampling flip-flop;

a plurality of read-only memory units for storing determined fault addresses of faulty data memory units, each of said plurality of read-only memory units connected to a corresponding one of said plurality of sampling flip-flops, an operability of each of said read-only memory units being checked by application of an input test data and by comparison of a read output test data with an expected nominal output test data, each of said read-only memory units having a latch circuit with a first data input, a second data input and a data output, each latch circuit including:

a first feedback inverter having an input and an output and a second feedback inverter having an input and an output; and a multiplexer switched, in a normal mode, to said first data input connecting said input of said first inverter with said output of said second inverter and closing a feedback loop of said latch circuit, and said multiplexer switched, in a test mode, to said second data input connecting said input of said first inverter with an output of said corresponding sampling flip-flop for injection of a test data into the feedback loop of said latch circuit.

2. The testable read-only memory according to claim 1, wherein each said read-only memory unit stores one address BIT of a fault address.

3. The testable read-only memory according to claim 1, wherein said read-only memory units comprise a fuse link device for non-erasable writing of an address BIT.

4. The testable read-only memory according to claim 3, wherein said fuse link device is a fusible resistor composed of one of metal and polysilicon.

5. The testable read-only memory according to claim 1, wherein said read-only memory unit has a read circuit for reading a written address BIT.

6. The testable read-only memory according to claim 1, which comprises a data output buffer connected to said second data input of said multiplexer and to said output of said first inverter.

7. The testable read-only memory according to claim 6, which further comprises a serial shift register with said sampling flip-flop, and wherein said data output buffer outputs the data to said sampling flip-flop in said serial shift register.

8. The testable read-only memory according to claim 1, wherein the data memory includes a redundant data memory and a main data memory.

9. The testable read-only memory according to claim 8, wherein the redundant control logic has a redundant address memory and the redundant data memory.

10. The testable read-only memory according to claim 8, wherein the redundant address memory is connected such that the fault addresses stored in said read-only memory can be read to the redundant address memory in the redundant control logic.

11. The testable read-only memory according to claim 8, wherein the redundant data memory comprises a plurality of redundant data memory units for replacement of faulty data memory units within the main data memory.

12. The testable read-only memory according to claim 8, wherein the redundant address memory units are registers.

13. The testable read-only memory according to claim 8, which comprises self-test logic integrated in the data memory, the input test data and the nominal output test data being produced by self-test logic integrated in the data memory.

* * * * *